(12) United States Patent
Tsai et al.

(10) Patent No.: US 7,026,207 B2
(45) Date of Patent: Apr. 11, 2006

(54) METHOD OF FILLING BIT LINE CONTACT VIA

(75) Inventors: Tzu-Ching Tsai, Taoyuan (TW); Yi-Nan Chen, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 49 days.

(21) Appl. No.: 10/715,611

(22) Filed: Nov. 18, 2003

(65) Prior Publication Data
US 2004/0197986 A1 Oct. 7, 2004

(30) Foreign Application Priority Data
Apr. 7, 2003 (TW) .............................. 92107878 A

(51) Int. Cl.
*H01L 21/8238* (2006.01)
(52) U.S. Cl. ..................... 438/233; 438/241; 438/675
(58) Field of Classification Search ........ 438/239–240, 438/257–256, 396, 397–399, 622–640, 618, 438/672, 675, 197, 199, 233, 241
See application file for complete search history.

(56) References Cited

U.S. PATENT DOCUMENTS

| | | | | |
|---|---|---|---|---|
| 6,069,038 A | * | 5/2000 | Hashimoto et al. | ......... 438/241 |
| 6,271,131 B1 | * | 8/2001 | Uhlenbrock et al. | ........ 438/681 |
| 6,458,651 B1 | * | 10/2002 | Rhodes | ....................... 438/253 |

* cited by examiner

*Primary Examiner*—Thanhha Pham
(74) *Attorney, Agent, or Firm*—Quintero Law Office

(57) ABSTRACT

A method of filling a bit line contact via. The method includes providing a substrate having a device region and periphery region, the device region having a transistor, having a gate electrode, drain region, and source region, on the substrate, forming a dielectric layer overlying the substrate, the dielectric layer having a bit line contact via exposing the drain region, and periphery contact via exposing the periphery region, forming a doped conductive layer, lower than the dielectric layer, overlying the drain region, conformally forming a barrier layer overlying the dielectric layer, doped conductive layer, and periphery region, and forming a first conductive layer filling the bit line contact via and periphery contact via.

1 Claim, 18 Drawing Sheets

METHOD OF FILLING BIT LINE CONTACT VIA

BACKGROUND OF THE INVENTION

1. Field of the Invention

The present invention relates to a method of filling a bit line contact via, and more specifically to a method of forming a conductive layer in the bit line contact via.

2. Description of the Related Art

FIGS. 1A through 1H are cross-sections illustrating a conventional method of filling a bit line contact via.

In FIG. 1A, first, a substrate 100, such as single crystalline silicon, having a device region 101, periphery region 102, and periphery region 103 is provided. The device region 101 has a transistor structure having a gate electrode 120 protruding from an active surface of substrate 100. A drain region 112 and source region 114 are disposed on the active surface on both sides of the gate electrode 120 respectively. Gate electrode 120 is a word line, having a multi-level structure as desired. For example, gate electrode 120 in FIG. 1A has gate dielectric layer 121, polycrystalline silicon layer 122 and metal silicide layer 123 as conductive layers, and hard mask layer 124 sequentially or the active surface of substrate 100. Periphery region 103 has the same multi-level structure as that of gate electrode 120. A patterned resist layer 191 overlying substrate exposes device region 101. The drain region 112 is doped with a dopant 10, usually an element in either group 13 (IIIA) or 15 (VA) of the periodic table such as As, by ion implantation in order to decrease the contact impedance of bit line contact when a conductive layer is subsequently formed on drain region 112.

In FIG. 1B, the patterned resist layer 191 is removed when ion implantation is completed. A silicon nitride layer is then formed on substrate 100 and patterned to form a spacer 125 on the sidewall of gate electrode 120. Further, if the recipe is not properly controlled during ion implantation, the dopant 10 in drain region 112 and source region 114 will diffuse, resulting in an extended drain region 112 and source region 114, thereby shortening the channel region between drain region 112 and source region 114.

In FIG. 1C, a dielectric layer 130 and patterned resist layer 192 are sequentially formed on substrate 100. The patterned resist layer 192 has openings 192a through 192c exposing a part of dielectric layer 130 respectively.

In FIG. 1D, the exposed dielectric layer 130 is removed by anisotropic etching using patterned resist layer 192 as an etching mask, forming a via 131 exposing drain region 112 as a bit line contact via, via 132 exposing substrate 100 as a contact via of periphery region 102, and via 133a exposing hard mask layer 124. The patterned resist layer 192 is then removed.

In FIG. 1E, a patterned resist layer 193 is formed on substrate 100. The patterned resist layer 193 has an opening 193a, approximately as large as via 133a, directly above via 133a, exposing the hard mask layer 124 in periphery region 103.

In FIG. 1F, the exposed hard mask layer 124 is removed by anisotropic etching using patterned resist layer 193 as an etching mask. Thus, via 133, exposing metal silicide layer 123, is formed as a contact via of periphery region 103. The patterned resist layer 193 is then removed.

In FIG. 1G, a conductive barrier layer 140 is conformally formed on the exposed active surface of substrate 100, avoiding the inter-diffusion between a subsequently formed conductive layer and every drain region 112 exposed by via 131, substrate 100 exposed by via 132, and metal silicide layer 123 exposed by via 133 which can negatively affect the electrical performance and reliability of the end product. The barrier layer 140, usually has a conductive TiN layer, formed by forming a Ti layer on the exposed active surface of substrate 100 using sputtering, and annealing substrate 100 in a nitrogen atmosphere.

In FIG. 1H, a tungsten layer is filled in vias 131 through 133 by chemical vapor deposition (CVD) as bit line contact and periphery contact.

As described in FIGS. 1A and 1B, the channel region between drain region 112 and source region 114 is shortened resulting from the extension of drain region 112 and source region 114. Therefore, exerting a lower voltage between drain region 112 and source region 114 can cause electric conduction, thereby negatively affecting the electric performance of device region 101.

Further, the sputtering step during formation of barrier layer 140 damages the lattice structure of drain region 112, resulting in unwanted carriers remaining in the drain region 112, thereby further negatively affecting electrical performance and reliability of the end product.

SUMMARY OF THE INVENTION

Thus, objects of the present invention are to provide a method of filling a bit line contact via, avoiding abnormal extension of drain region and source region resulting from directly doping the exposed drain region and source region using ion implantation, and resulting in unwanted carriers and lattice damage in the exposed drain region, in order to improve electrical performance and reliability of the end product.

In order to achieve the described objects, the present invention provides a method of filling a bit line contact via. First, a substrate having a device region and periphery region is provided. The device region has a transistor having a gate electrode, drain region, and source region, on the substrate. Then, a dielectric layer is formed overlying the substrate. The dielectric layer has a bit line contact via exposing the drain region, and periphery contact via exposing the periphery region. Next, a doped conductive layer, lower than the top surface of the gate electrode, is formed overlying the drain region. Further, a barrier layer is conformally formed overlying the dielectric layer, doped conductive layer, and periphery region. Finally, a first conductive layer is formed filling the bit line contact via and periphery contact via.

BRIEF DESCRIPTION OF THE DRAWINGS

The present invention can be more fully understood by reading the subsequent detailed description in conjunction with the examples and references made to the accompanying drawings, wherein:

FIGS. 2A through 2J are cross-sections illustrating a method of filling a bit line contact via of the present invention.

DETAILED DESCRIPTION OF THE INVENTION

The following embodiment is intended to illustrate the invention more fully without limiting the scope of the claims, since numerous modifications and variations will be apparent to those skilled in this art.

FIGS. 2A through 2J are cross-sections illustrating a method of filling a bit line contact via of the present invention.

Figure 1A:
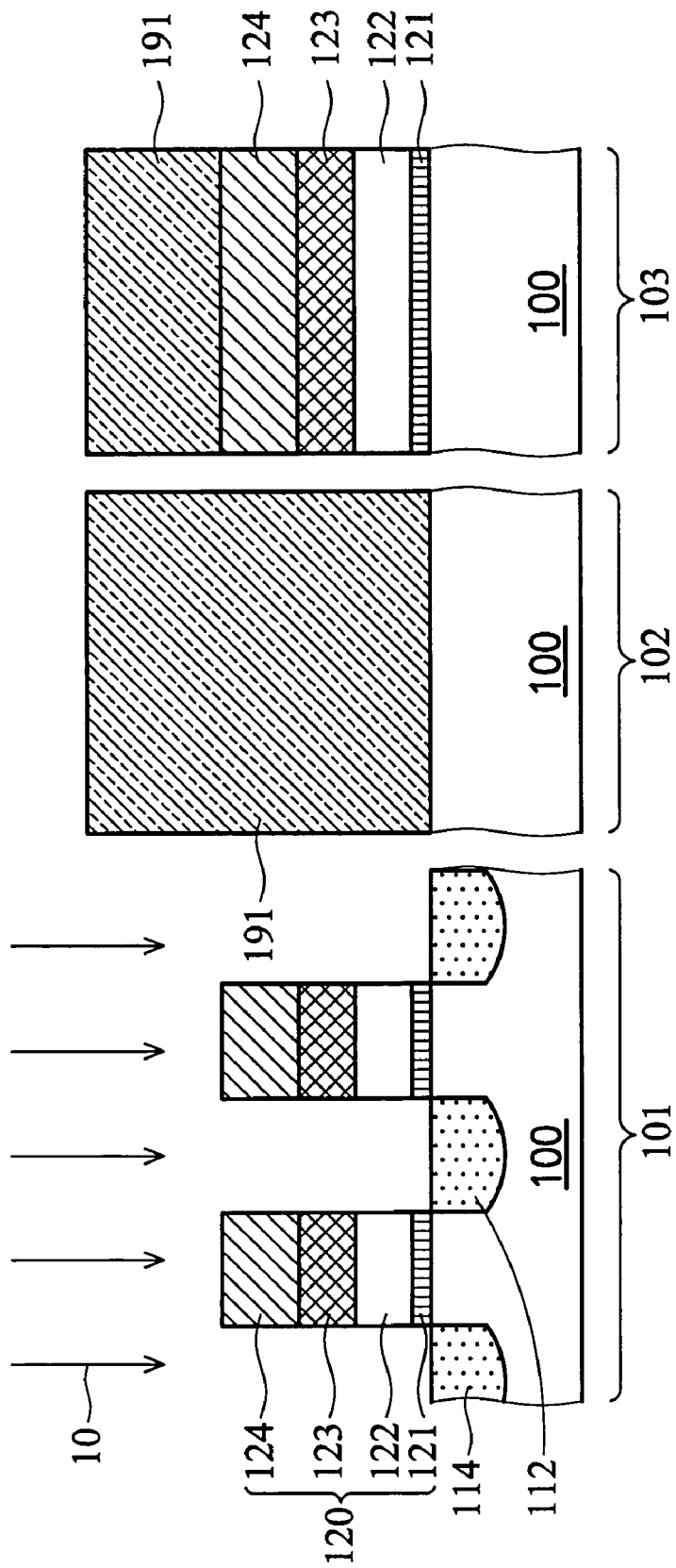
FIGS. 1A through 1H are cross-sections illustrating a conventional method of filling a bit line contact via.
Figure 1B:
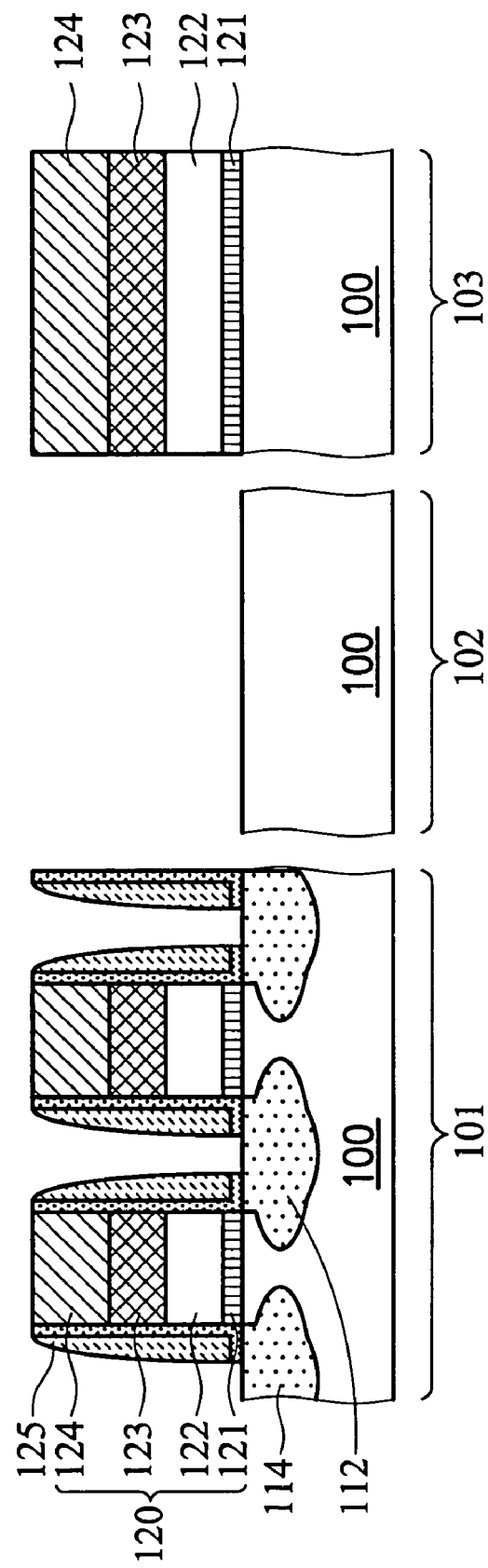
Figure 1C:
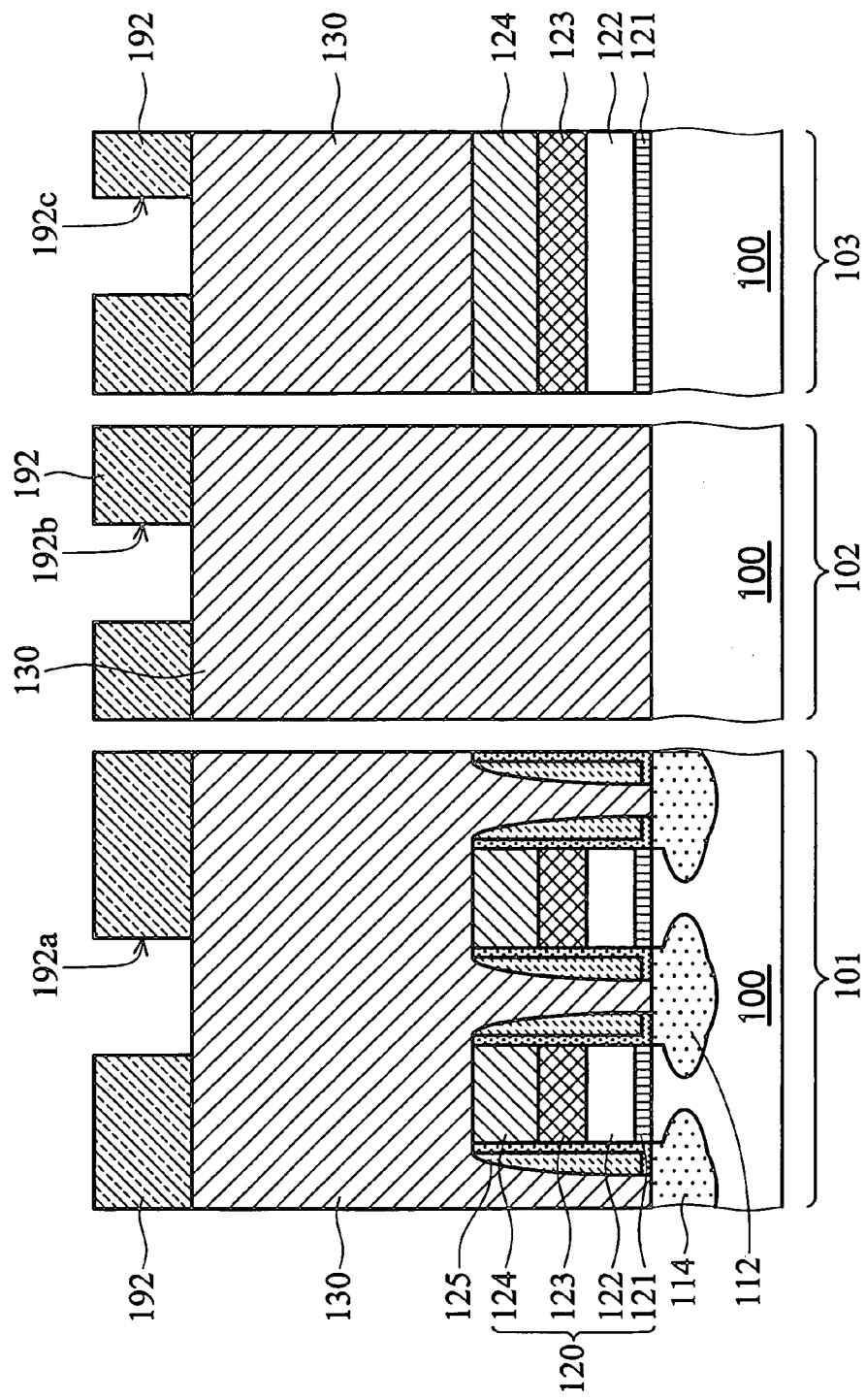
Figure 1D:
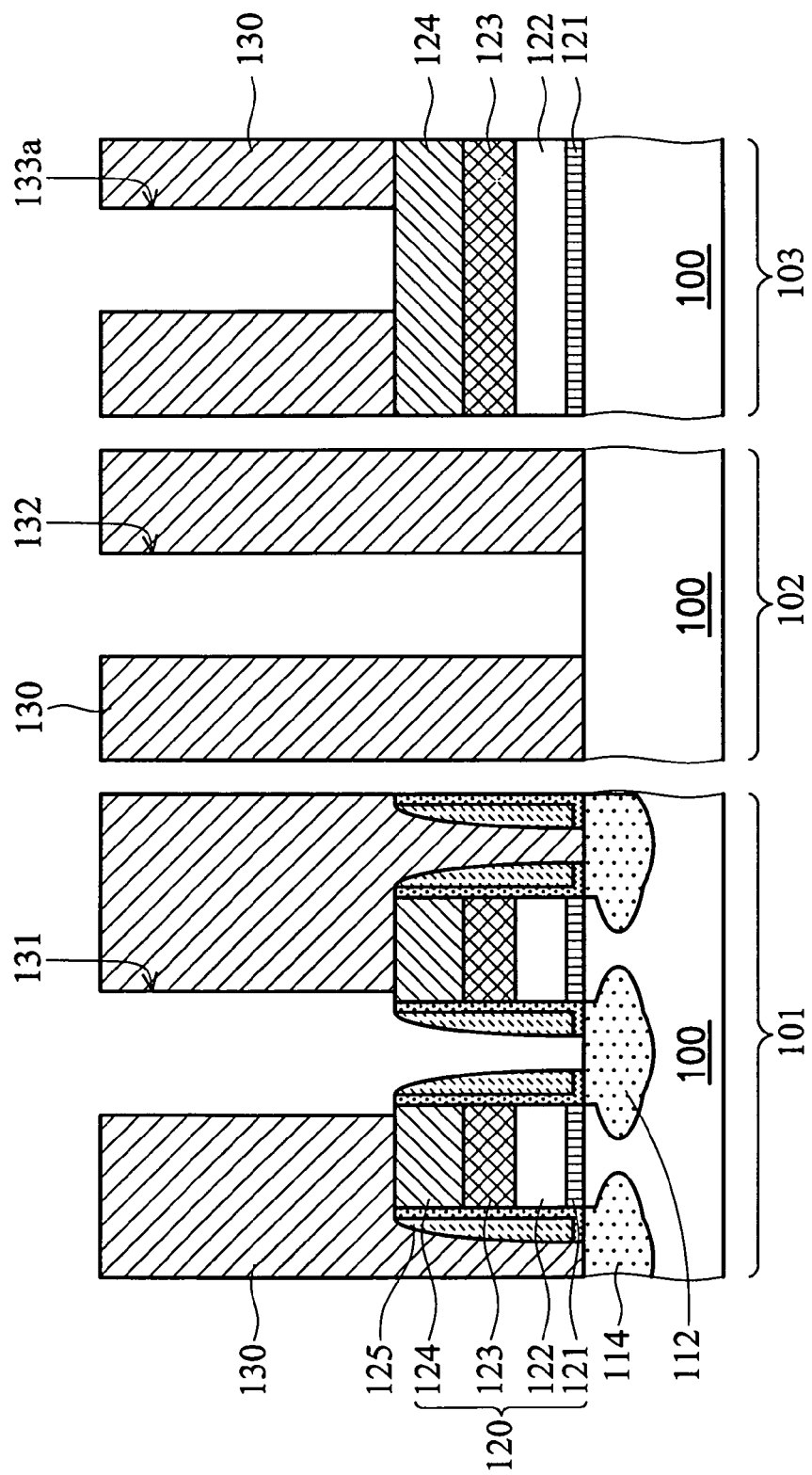
Figure 1E:
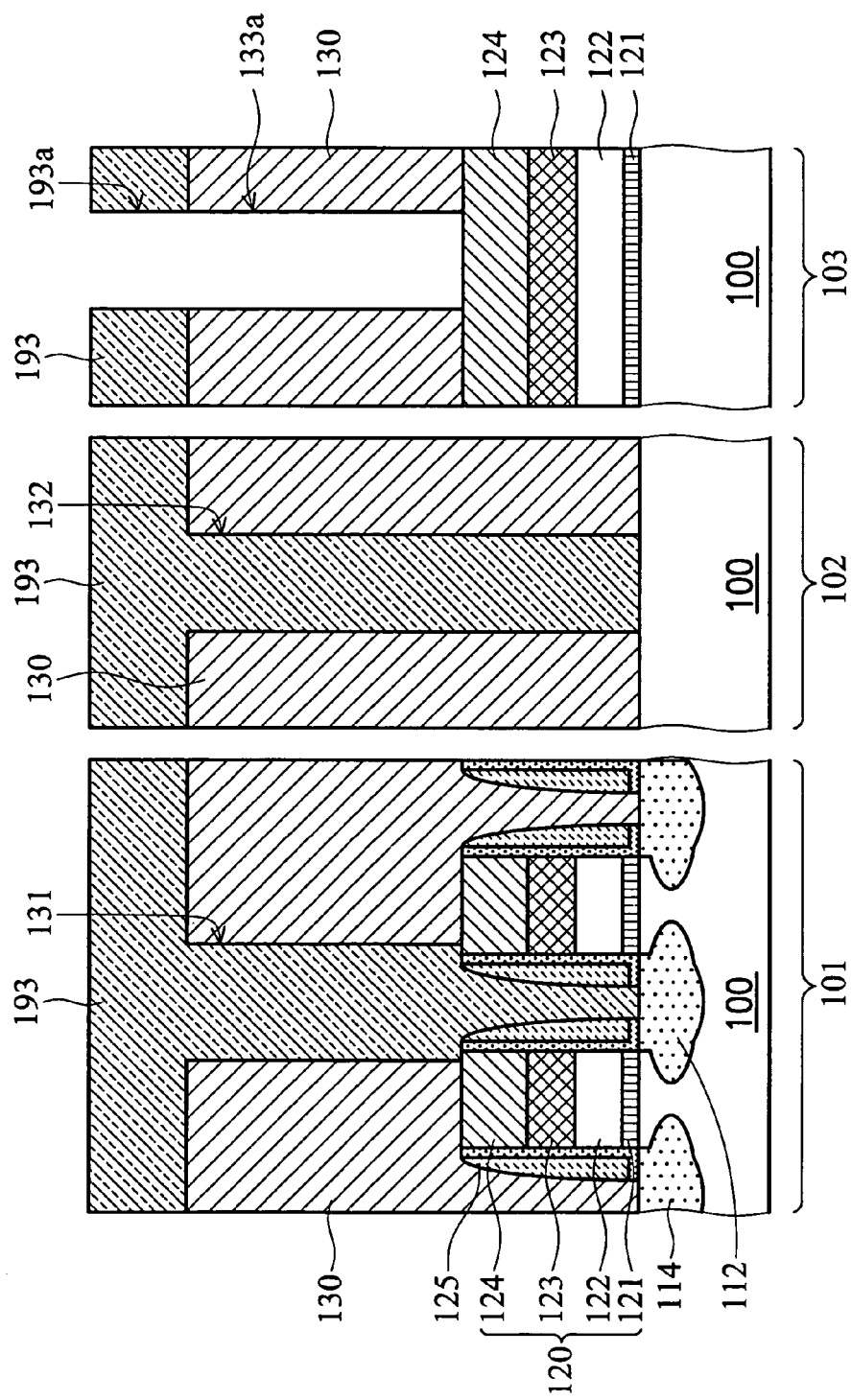
Figure 1F:
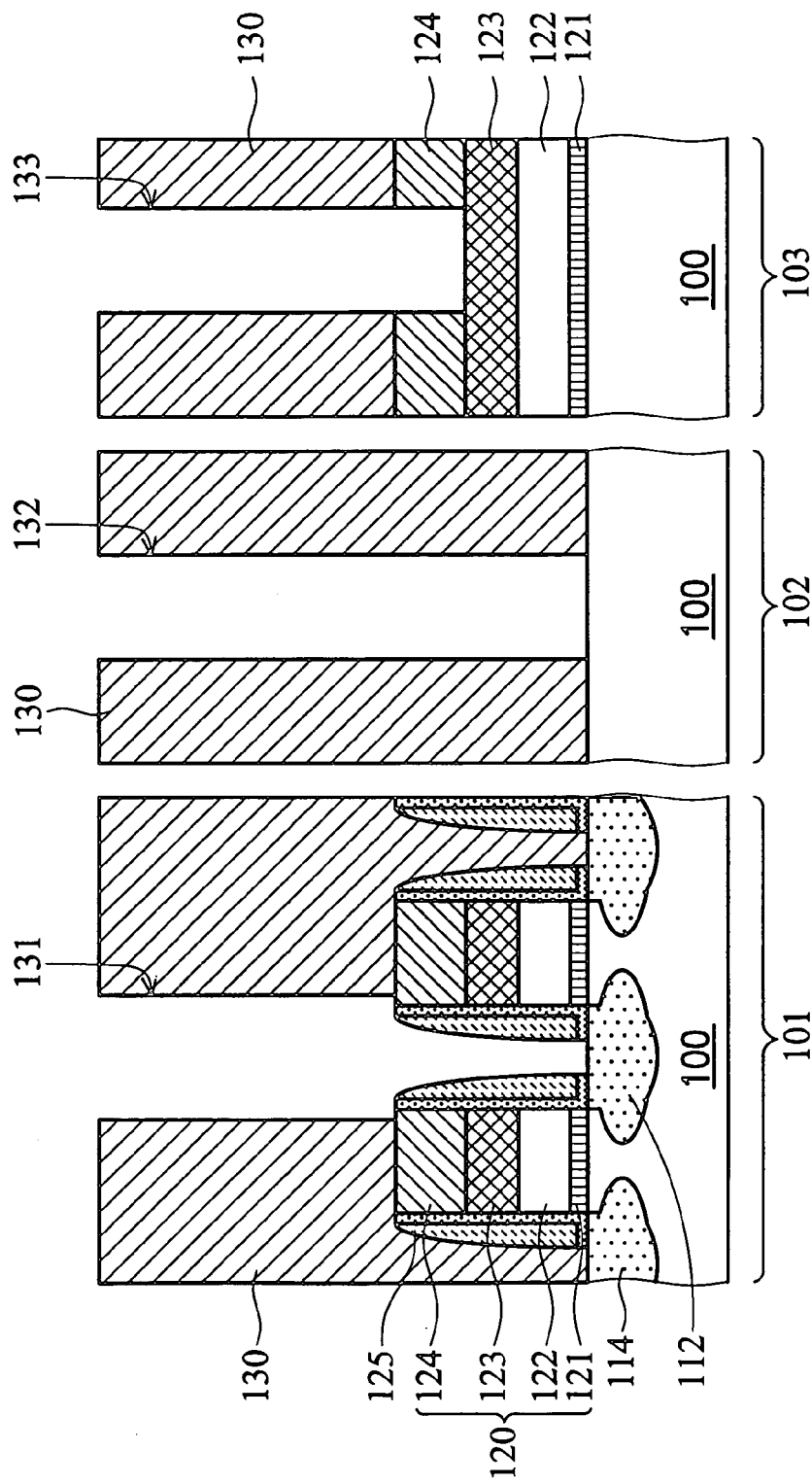
Figure 1G:
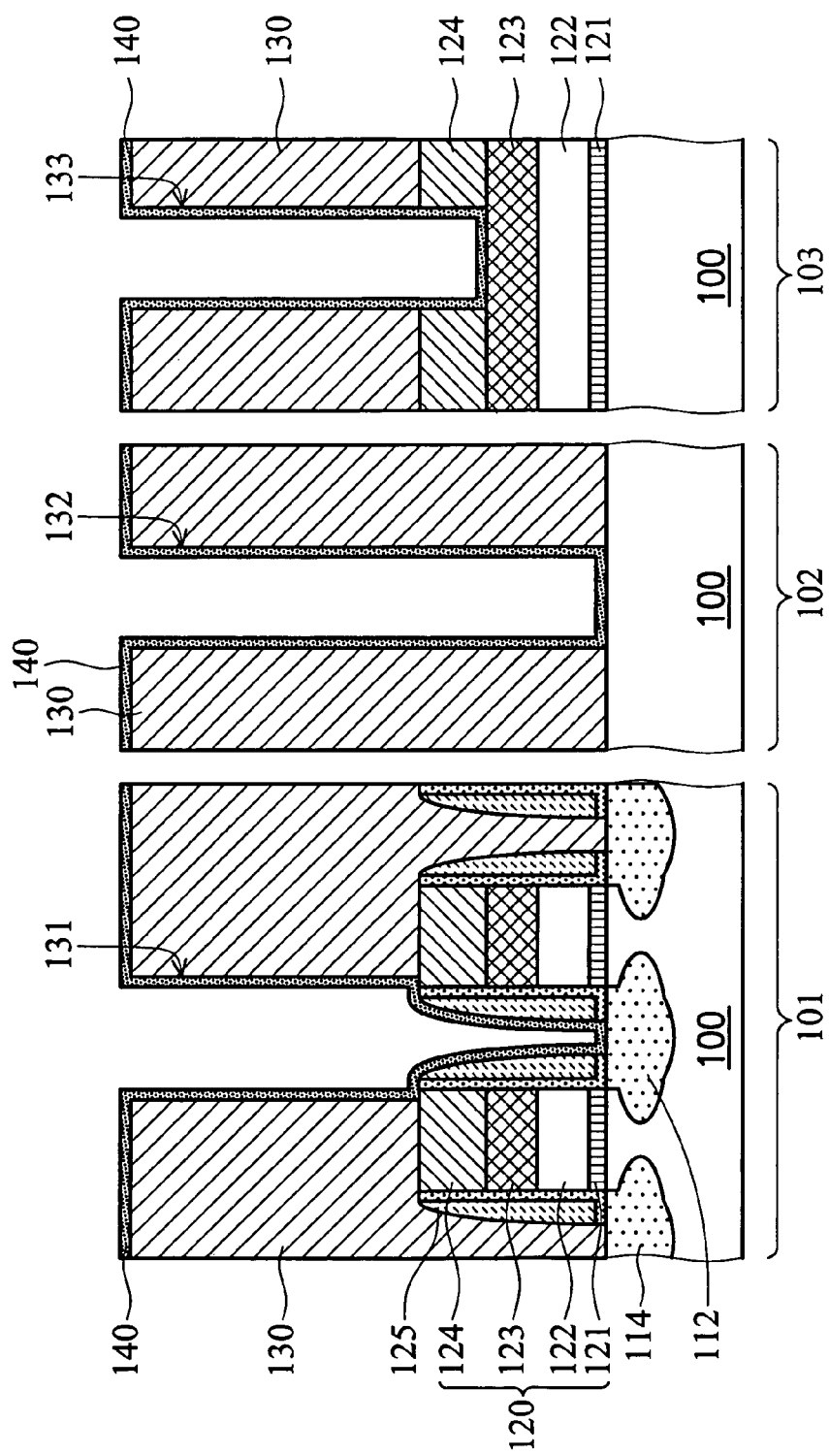
Figure 1H:
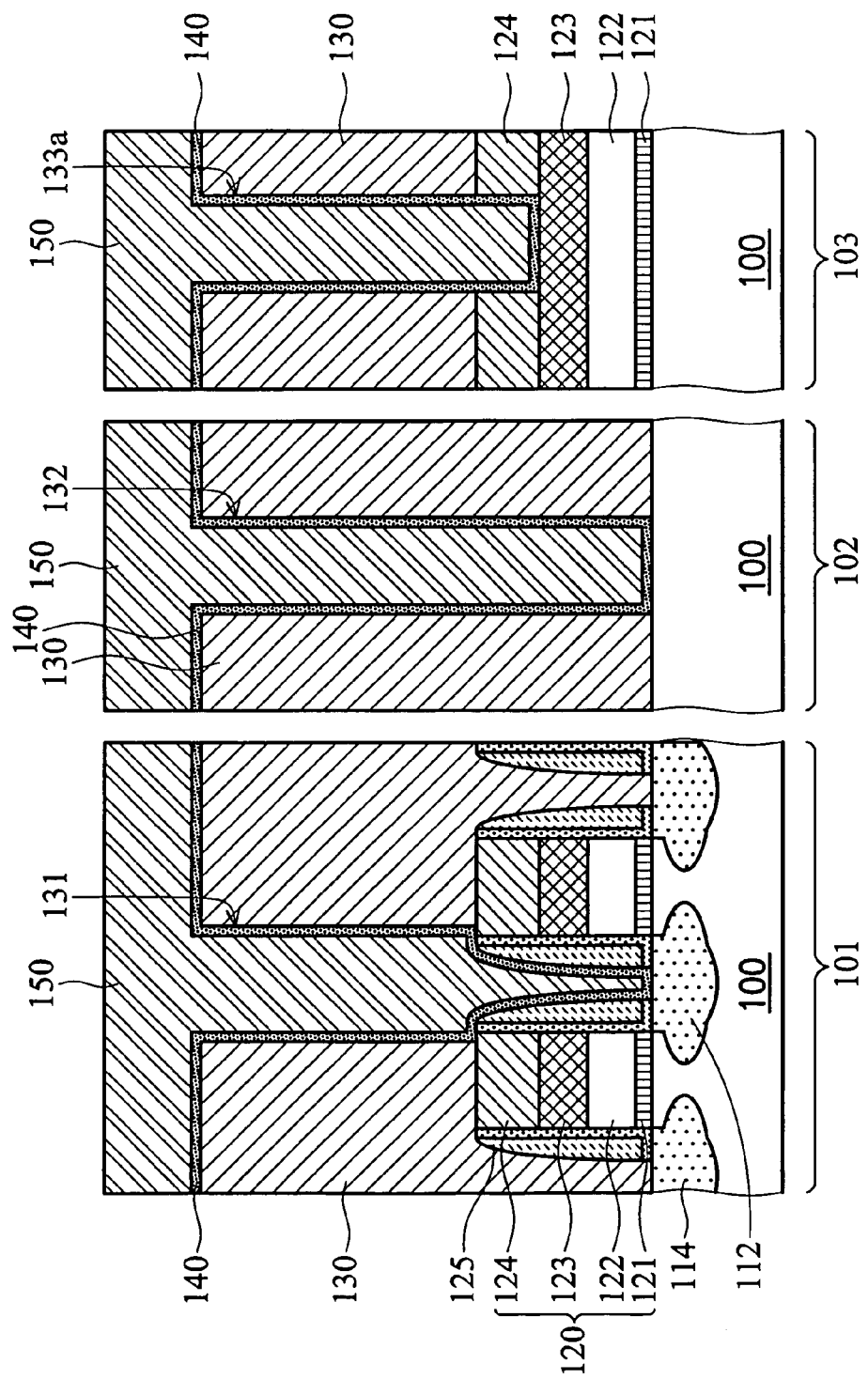
Figure 2A:
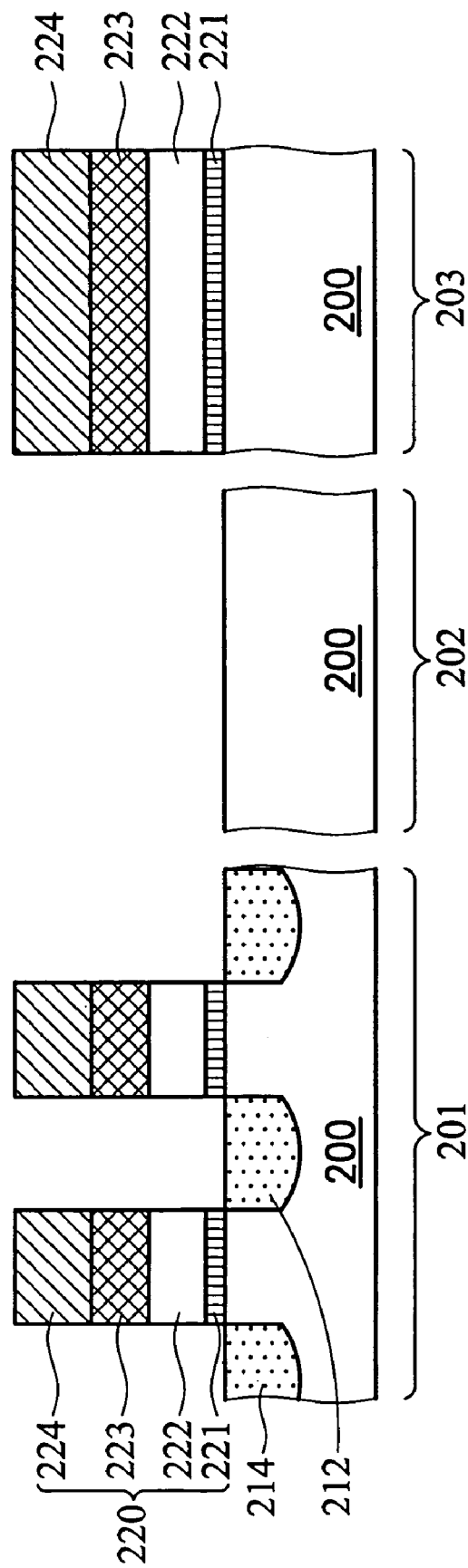

In FIG. 2A, first, a substrate 200, such as single crystalline silicon, having a device region 201, periphery region 202, and periphery region 203, is provided. The device region 201 has a transistor structure having a gate electrode 220 protruding from an active surface of substrate 200. A drain region 212 and source region 214 are disposed on the active surface respectively on both sides of the gate electrode 220. Gate electrode 220 is a word line, having a multi-level structure as needed. For example, gate electrode 220 in FIG. 2A has gate dielectric layer 221 such as an oxide layer, polycrystalline silicon layer 222 and metal silicide layer 223, such as tungsten silicide, as conductive layers, and hard mask layer 224 such as silicon nitride sequentially from the active surface of substrate 200. Periphery region 203 has the same multi-level structure as that of gate electrode 220. Compared to the known art, neither drain region 212 nor source region 214 is doped by ion implantation in this embodiment. Doping steps on drain region 212 of the present invention are shown in subsequent FIGS. 2G and 2H.

Figure 2B:
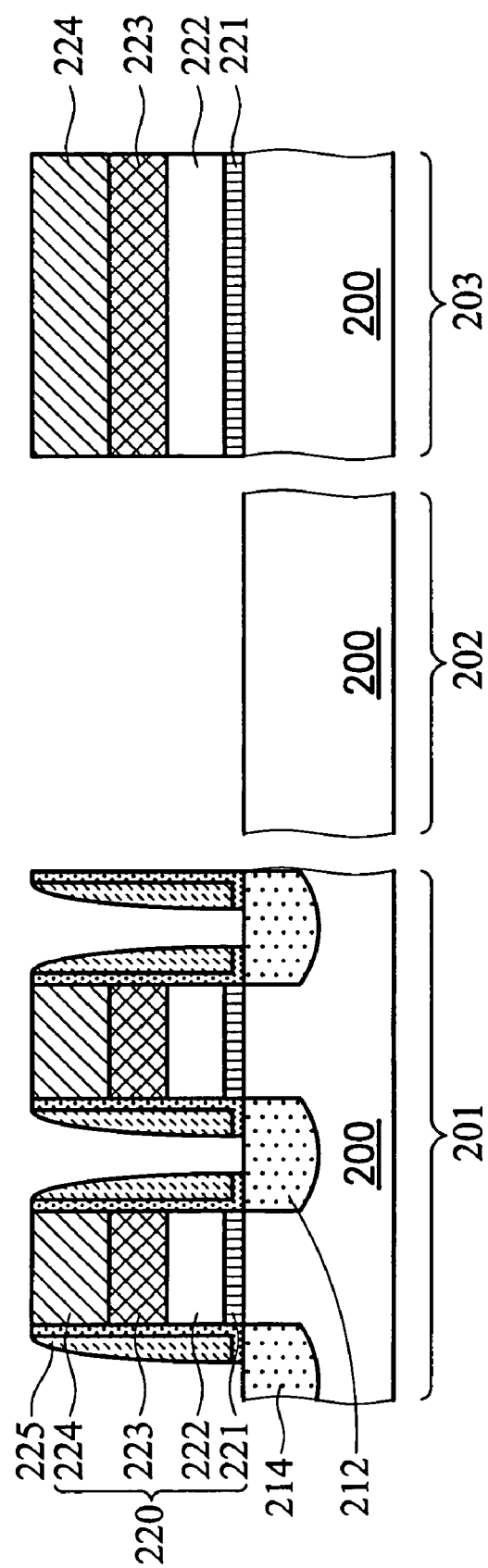

In FIG. 2B, an insulting layer such as silicon nitride is formed overlying substrate 200 and patterned in order to form spacer 225 overlying the sidewall of gate electrode 220. Compared to the known art, drain region 212 and source region 214 still maintain their original range resulting from not doped by ion implantation, thereby maintaining the channel region between drain region 212 and source region 214.

Figure 2C:
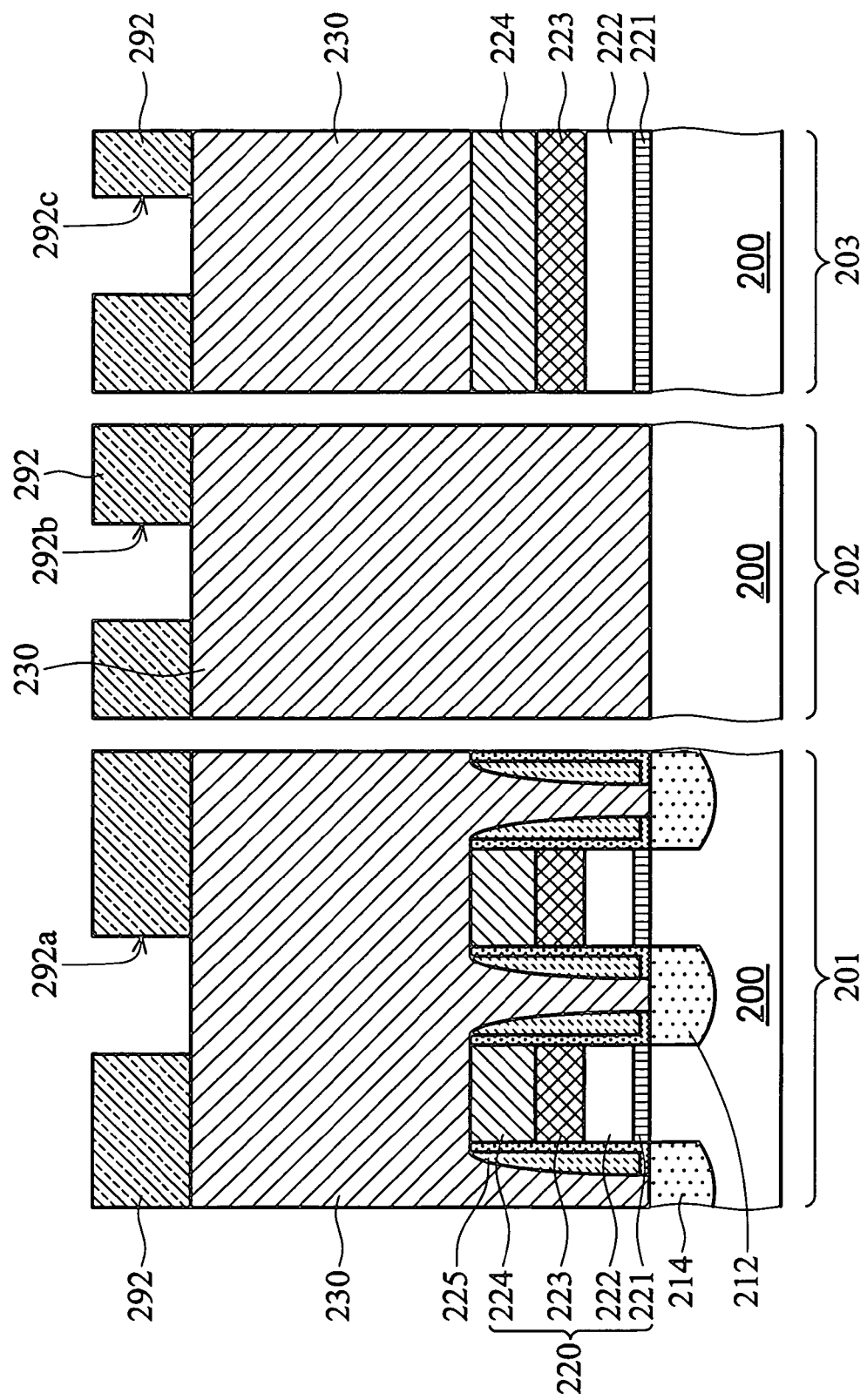

In FIG. 2C, a dielectric layer 230 such as an oxide layer and a patterned resist layer 292 are sequentially formed overlying substrate 200. Further, formation of dielectric layer 230 can be divided into a plurality of sub-steps such as forming a boro-phosphosilicate glass (BPSG) layer (not shown), capable of filling a tiny hole, overlying substrate 200, planarizing the BPSG layer, blanketly forming an oxide layer (not shown) overlying the BPSG layer using methods such as CVD, using a precursor comprising tetra ethoxysilane (TEOS), and planarizing the oxide layer. The patterned resist layer 292 has openings 292a through 292c exposing a part of dielectric layer 230.

Figure 2D:
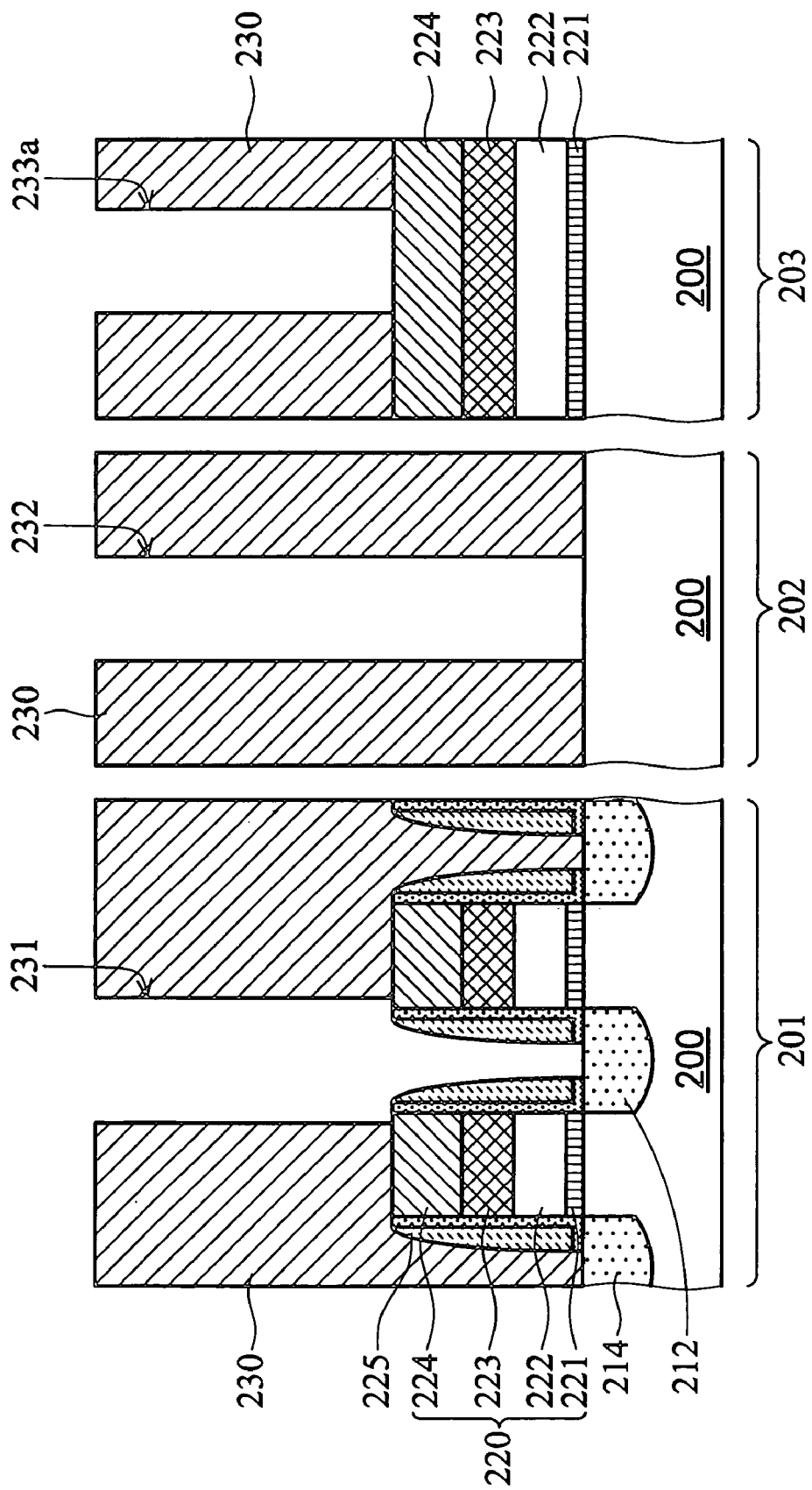

In FIG. 2D, the exposed dielectric layer 230 is removed by anisotropic etching using the patterned resist layer 292 as an etching mask in order to form a via 231 as a bit line contact via exposing drain region 212, via 232 as a contact via of periphery region 232, exposing substrate 200, and via 233a exposing hardmask 224. The patterned resist layer 292 is then removed.

Figure 2E:
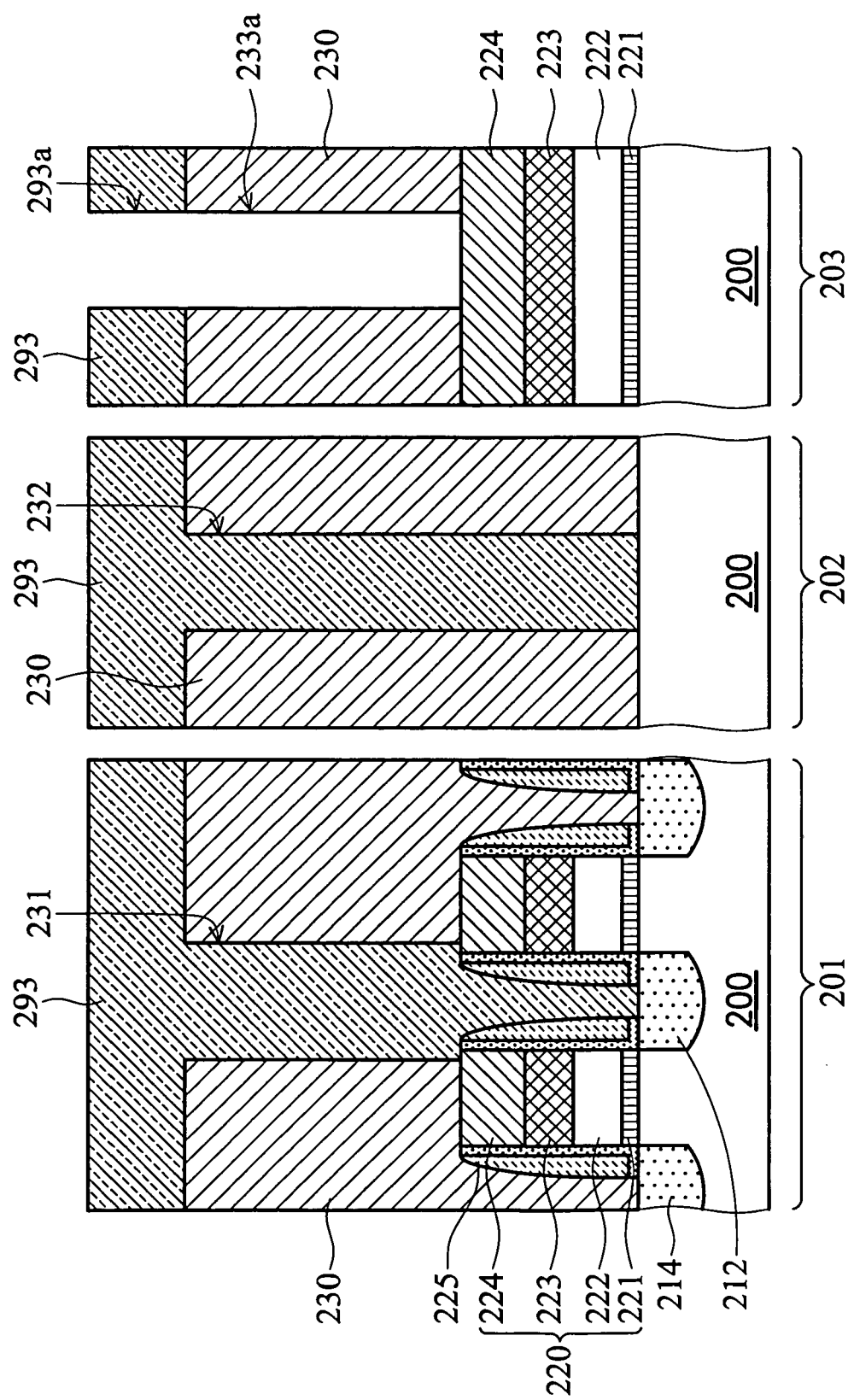

In FIG. 2E, a patterned resist layer 293 is formed on substrate 200. The patterned resist layer 293 has an opening 293a, approximately as large as via 233a, directly above via 233a, exposing the hard mask layer 224 in periphery region 203.

Figure 2F:
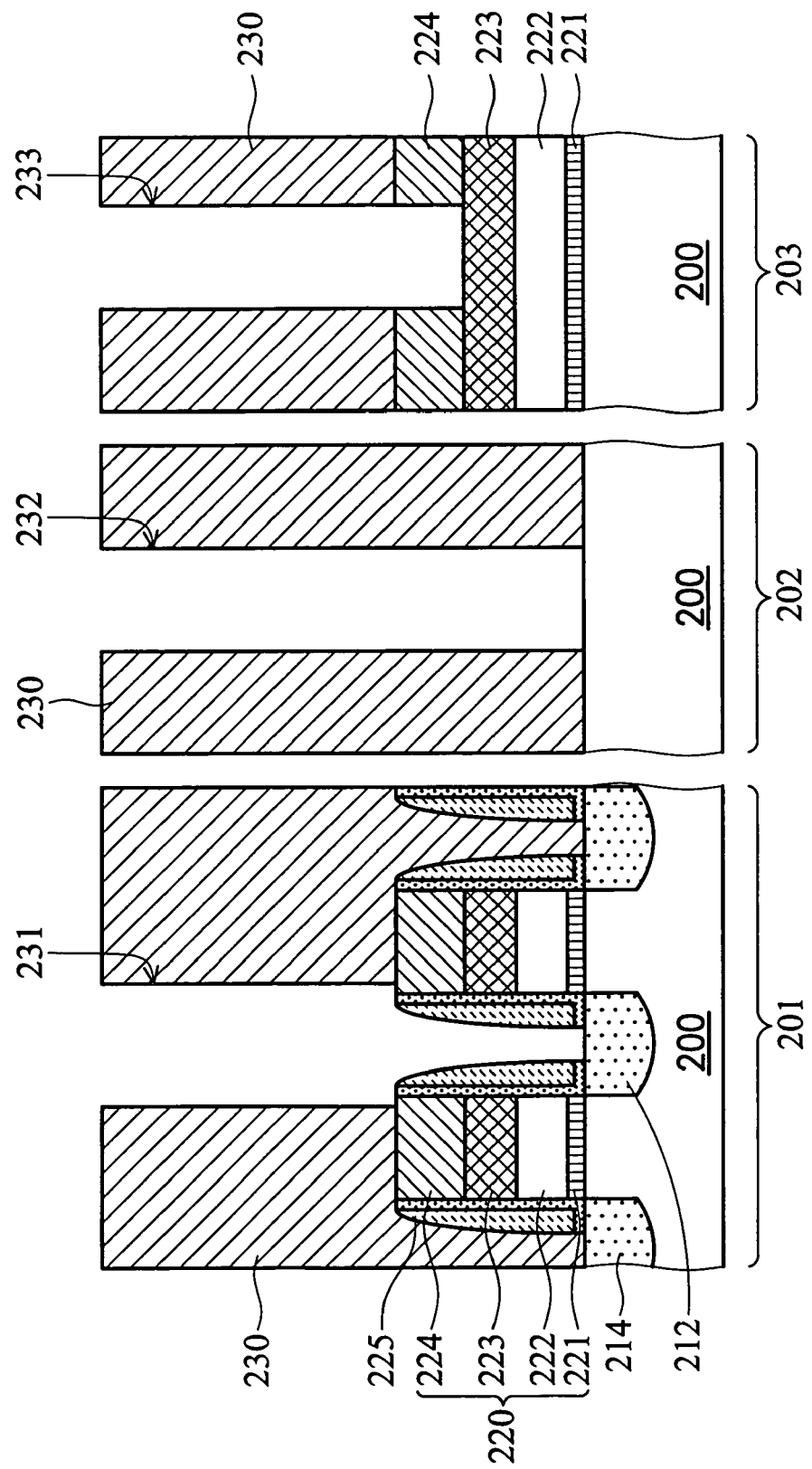

In FIG. 2F, the exposed hard mask layer 224 is removed by anisotropic etching using patterned resist layer 293 as an etching mask. Thus, via 233, exposing metal silicide layer 223, is formed as a contact via of periphery region 203. The patterned resist layer 293 is then removed.

Figure 2G:
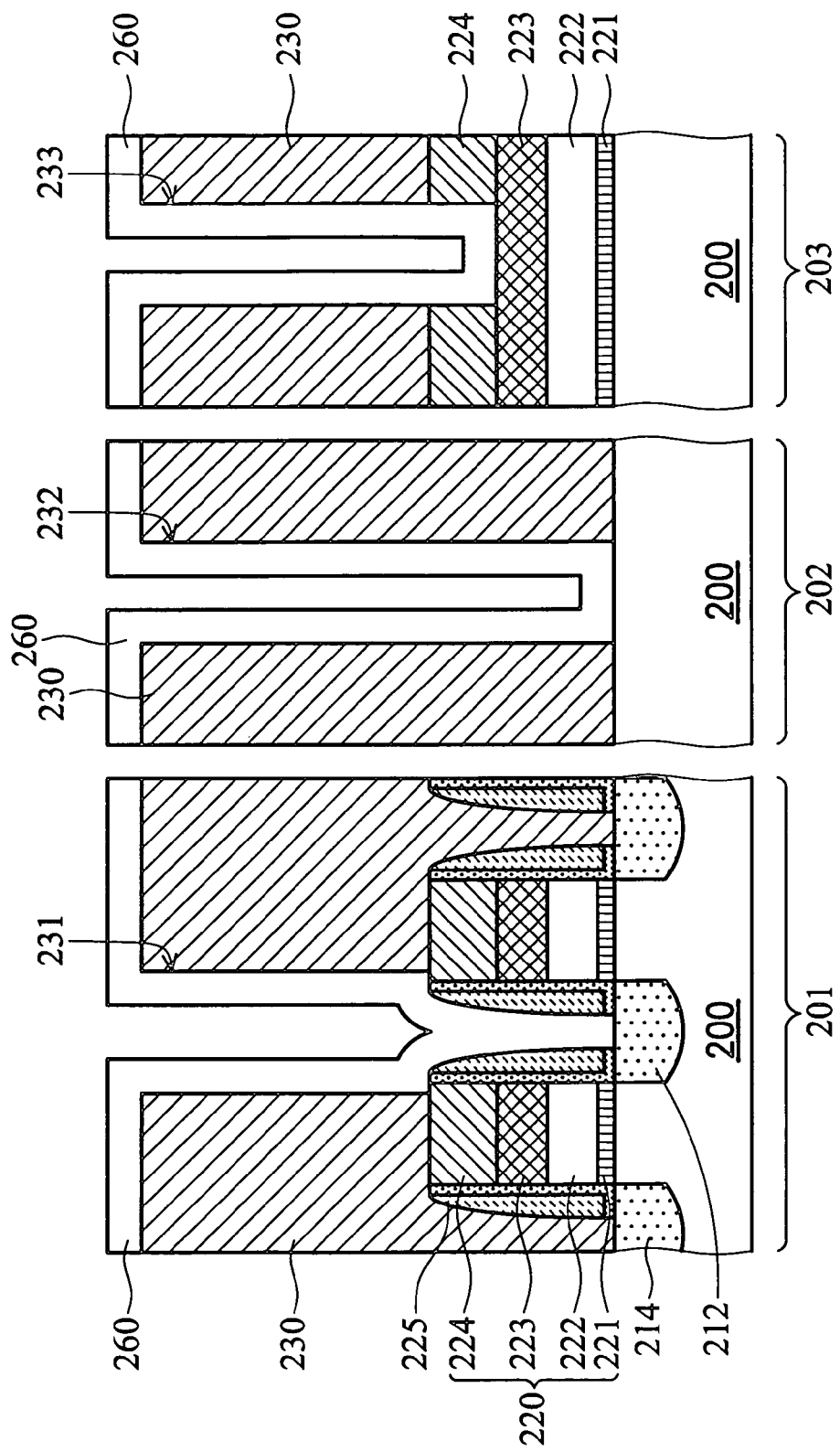

In FIG. 2G, a conductive layer 260 doped with an element in either group 13 (IIIA) or 15 (VA) of periodic table on all the exposed surface of substrate 200. The conductive layer 260 is preferably polycrystalline silicon doped with As. Dopants in conductive layer 260 can diffuse into drain region 212, resulting in decreasing the contact impedance of bit line contact when a doped conductive layer is conformally formed overlying the drain region 212, dielectric layer 230, and periphery region 203, and further maintaining the original ranges of drain region 212 and source region 214, thereby maintaining the designed electrical performance of device 201 and improving the electrical performance of the end product.

Figure 2H:
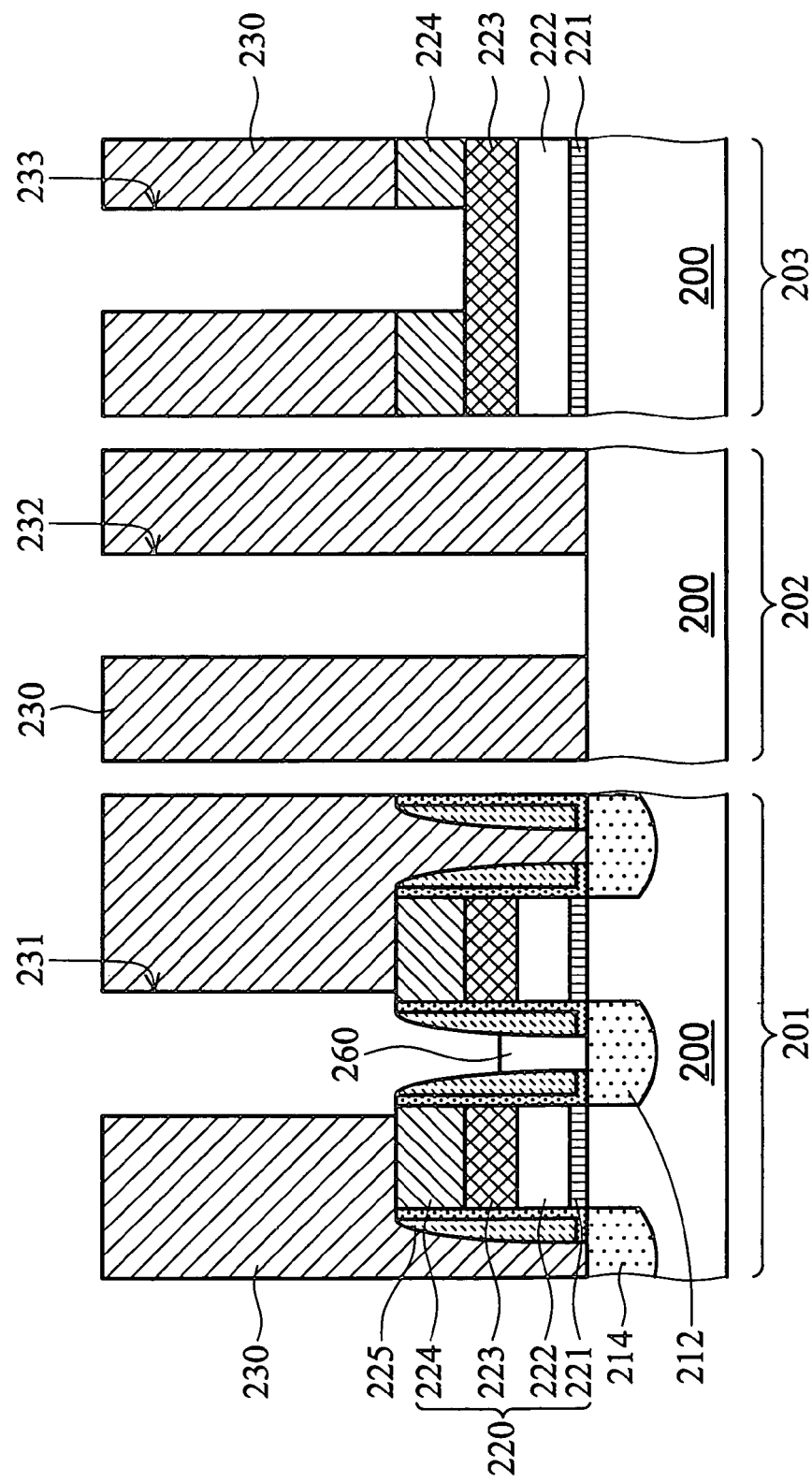
Figure 21:
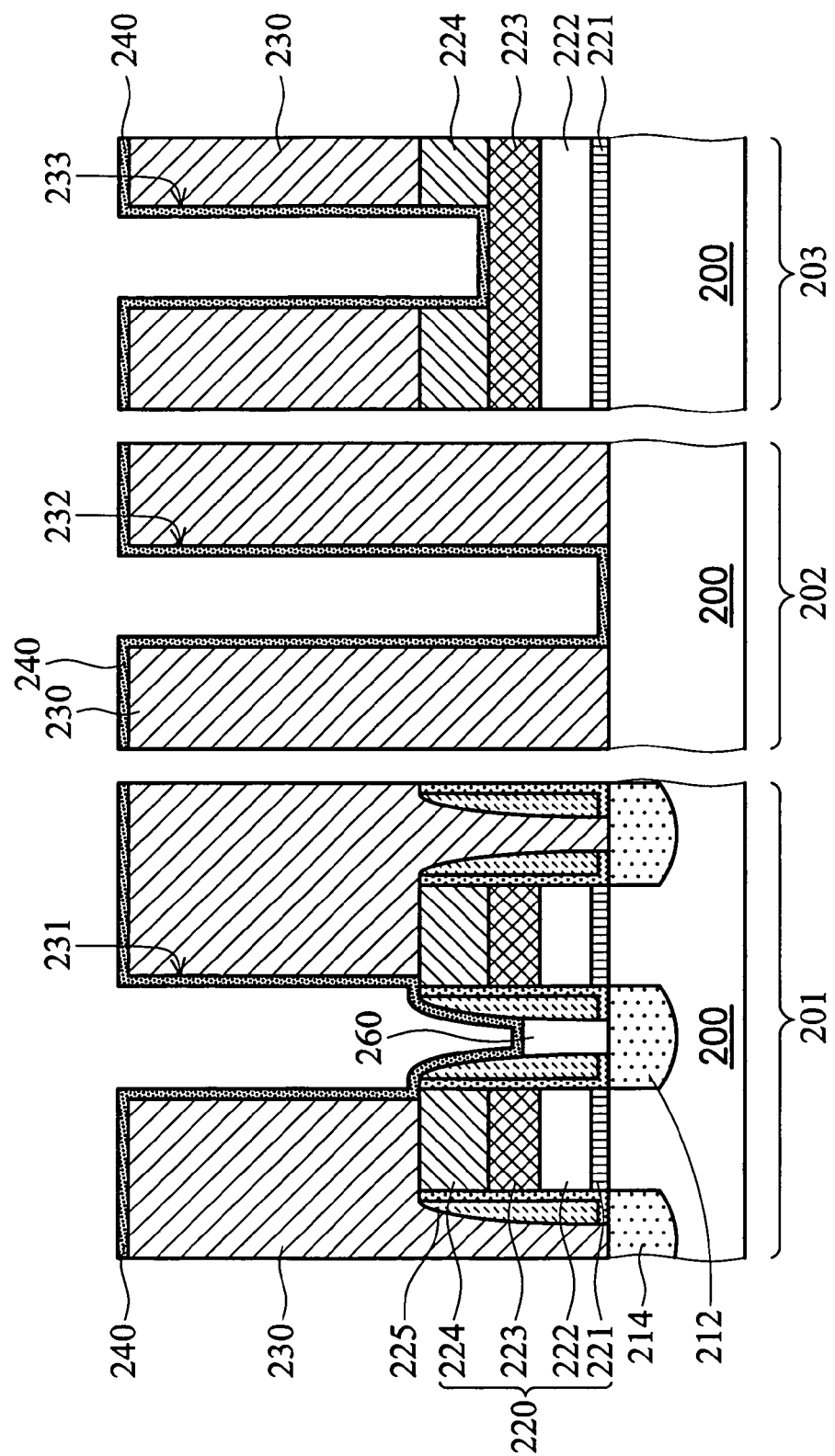

In FIG. 2H, the doped conductive layer is etched to leave a remaining portion of the doped conductive layer 260 lower than the top surface of the gate electrode 220 overlying the drain region 212.

In FIG. 2I, a conductive barrier layer 240 is conformally formed overlying substrate 200, avoiding the inter-diffusion between a subsequently formed conductive layer and every drain region 212 exposed by via 231, substrate 200 exposed by via 232, and metal silicide layer 223 exposed by via 233 which can negatively affect electrical performance and reliability of the end product. The barrier layer 240, usually has a conductive TiN layer, formed by forming a Ti layer on the exposed active surface of substrate 200 using sputtering, and annealing substrate 200 in a nitrogen atmosphere. Compared to the known art, the previously formed conductive layer 260 protects drain region 212 from damage resulting from sputtering during formation of barrier 240, neither unwanted carriers remain nor lattice damage occurs in the drain region 212, thereby improving electrical performance, and reliability of the end product.

Figure 2J:
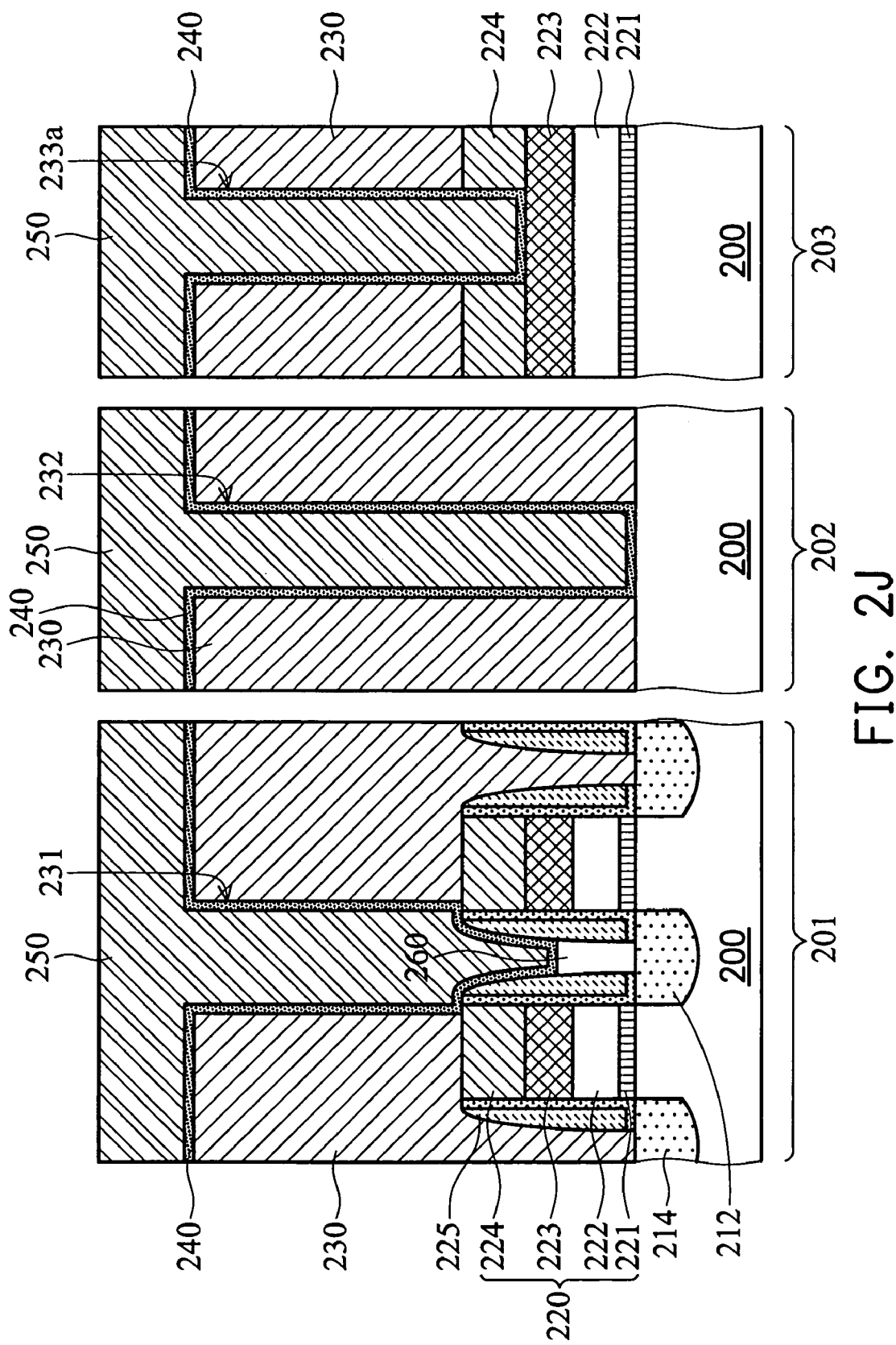

In FIG. 2J, a conductive layer 250, such as tungsten, as bit line contact and periphery contact is filled in vias 231 through 233 by methods such as CVD.

Thus, the results shown prove efficacy of the inventive method in forming a doped conductive layer as bit line contact on a drain region as a dopant source and passivation, avoiding abnormal extension of the drain region and source region, and eliminating unwanted carriers and lattice damage in the exposed drain region, achieving the objects of the present invention.

Although the present invention has been particularly shown and described with reference to the preferred specific embodiment and example, it is anticipated that alterations and modifications thereof will no doubt become apparent to those skilled in the art. It is therefore intended that the following claims be interpreted as covering all such alteration and modifications as fall within the true spirit and scope of the present invention.

What is claimed is:

1. A method of a filling bit line contact via, comprising:
providing a substrate having a device region and periphery region, the device region having a transistor with a gate electrode, drain region, and source region on the substrate;
forming a dielectric layer overlying the substrate, the dielectric layer having a bit line contact via exposing the drain region, and periphery contact via exposing the periphery region;
conformally forming a doped conductive layer overlying the drain region, dielectric layer, and periphery contact via;
etching the doped conductive layer to leave only a remaining portion of the doped conductive layer lower than the top surface of the gate electrode overlying the drain region;
conformally forming a barrier layer overlying the dielectric layer, doped conductive layer, and periphery contact via; and
forming a first conductive layer filling the bit line contact via and periphery contact via.

* * * * *